(12) United States Patent
Oshemkov et al.

(10) Patent No.: US 8,735,030 B2
(45) Date of Patent: May 27, 2014

(54) METHOD AND APPARATUS FOR MODIFYING A SUBSTRATE SURFACE OF A PHOTOLITHOGRAPHIC MASK

(75) Inventors: Sergey Oshemkov, Karmiel (IL); Ralph Klaesges, Aalen (DE); Markus Mengel, Heidenheim (DE)

(73) Assignees: Carl Zeiss SMT GmbH, Oberkochen (DE); Carl Zeiss SMS GmbH., Jena (DE); Carl Zeiss SMS Ltd, Karmiel (IL)

( * ) Notice: Subject to any disclaimer, the term of this patent is extended or adjusted under 35 U.S.C. 154(b) by 115 days.

(21) Appl. No.: 13/084,991

(22) Filed: Apr. 12, 2011

(65) Prior Publication Data

US 2011/0255065 A1    Oct. 20, 2011

Related U.S. Application Data

(60) Provisional application No. 61/324,467, filed on Apr. 15, 2010.

(51) Int. Cl.
*G03F 1/72* (2012.01)
*C03C 15/00* (2006.01)

(52) U.S. Cl.
USPC .............................................. 430/30; 216/65

(58) Field of Classification Search
USPC ................... 430/5, 30, 394; 378/35
See application file for complete search history.

(56) References Cited

U.S. PATENT DOCUMENTS

| | | | |
|---|---|---|---|
| 4,420,686 A | 12/1983 | Onoguchi et al. | |
| 4,926,054 A | 5/1990 | Frosien | |
| 5,206,496 A | 4/1993 | Clement et al. | |
| 5,355,212 A | 10/1994 | Wells et al. | |
| 5,625,193 A | 4/1997 | Broude et al. | |
| 5,637,244 A | 6/1997 | Erokhin | |
| 5,694,249 A | 12/1997 | Misawa | |
| 5,761,111 A | 6/1998 | Glezer | |
| 5,786,560 A | 7/1998 | Tatah et al. | |
| 5,864,394 A | 1/1999 | Jordan, III et al. | |
| 6,037,589 A | 3/2000 | Yonezawa et al. | |
| 6,087,617 A | 7/2000 | Troitski et al. | |
| 6,091,249 A | 7/2000 | Talbot et al. | |
| 6,205,818 B1 | 3/2001 | Seward, III | |
| 6,566,655 B1 | 5/2003 | Choo et al. | |
| 6,614,520 B1 | 9/2003 | Bareket et al. | |
| 6,654,489 B2 | 11/2003 | Wiley et al. | |

(Continued)

FOREIGN PATENT DOCUMENTS

| | | | | |
|---|---|---|---|---|
| DE | 10 2009 056 119 | 7/2010 | ............. | F04C 2/107 |
| JP | 03-84441 | 4/1991 | ............. | G01N 12/88 |

(Continued)

OTHER PUBLICATIONS

L.N. Allen et al., "An ion figuring system for large optics fabrication", Proc. SPIE 1168, p. 33-50 (1989).

(Continued)

*Primary Examiner* — Stephen Rosasco
(74) *Attorney, Agent, or Firm* — Fish & Richardson P.C.

(57) ABSTRACT

Disclosed is a method of modifying of a surface of a substrate of a photolithographic mask for extreme ultraviolet radiation comprising the step of focusing femtosecond light pulses of a laser system onto the substrate so that a plurality of color centers is generated inside the substrate, wherein the color centers are distributed to cause a modification of the substrate surface.

12 Claims, 13 Drawing Sheets

(56) References Cited

U.S. PATENT DOCUMENTS

| | | |
|---|---|---|
| 6,677,586 B1 | 1/2004 | Nasser-Ghodsi et al. |
| 6,812,462 B1 | 11/2004 | Toth et al. |
| 6,821,682 B1 | 11/2004 | Stearns et al. |
| 6,843,927 B2 | 1/2005 | Naser-Ghodsi |
| 6,844,272 B2 | 1/2005 | Taylor et al. |
| 6,855,938 B2 | 2/2005 | Preikszas et al. |
| 6,858,537 B2 | 2/2005 | Brewer |
| 6,999,611 B1 | 2/2006 | Lopez et al. |
| 7,046,352 B1 | 5/2006 | Dayal et al. |
| 7,123,356 B1 | 10/2006 | Stokowski et al. |
| 7,133,119 B1 | 11/2006 | Pettibone et al. |
| 7,297,453 B2 | 11/2007 | Watson et al. |
| 7,300,725 B2 | 11/2007 | Watson et al. |
| 7,300,729 B2 | 11/2007 | Watson et al. |
| 7,303,842 B2 | 12/2007 | Watson et al. |
| 7,304,731 B2 | 12/2007 | Hill |
| 7,352,452 B2 | 4/2008 | Wegmann et al. |
| 2005/0084767 A1* | 4/2005 | Zait et al. ............ 430/5 |
| 2007/0065729 A1 | 3/2007 | Zait et al. |
| 2007/0224522 A1 | 9/2007 | Lee et al. |
| 2008/0033206 A1 | 2/2008 | Harris et al. |

FOREIGN PATENT DOCUMENTS

| | | | |
|---|---|---|---|
| JP | 03-84548 | 4/1991 | ........... G03F 1/08 |
| JP | 05-226212 | 9/1993 | ........... H01L 12/027 |
| JP | 10-223574 | 8/1998 | ........... H01L 21/302 |
| WO | 01/45136 | 6/2001 | ........... H01J 37/28 |
| WO | 2005/008333 | 1/2005 | |
| WO | WO 2011/076527 | 6/2011 | ........... G02B 1/12 |

OTHER PUBLICATIONS

Martin Ams et al., "Investigation of Ultrafast Laser-Photonic Material Interactions: Challenges for Directly Written Glass Photonics", *IEEE Journal of Selected Topics in Quantum Electronics*, vol. 14, No. 5, pp. 1370-1381 (Sep./Oct. 2008).

Peter Bechtold et al., "Non-thermal Micro Adjustment Using Ultrashort Laser Pulses", *Journal of Laser Micro/Nanoengineering*, vol. 2, No. 3, pp. 183-188 (2007).

Grant Davis et al., "Automated aerialimagebased CD metrology initiated by pattern marking with photomask layout data", *PMJ Photomask Japan Conference* (2007).

K. M. Davis et al., "Writing waveguides in glass with a femtosecond laser", *Optics Letters*, vol. 21, No. 21, pp. 1729-1731 (Nov. 1, 1996).

O.M. Efimov et al., "Color center generation in silicate glasses exposed in infrared femtosecond pulses", J. Opt. Soc. Am., vol. 15, p. 193-199 (1998).

F. Frost et al., "Large area smoothing of optical surfaces by low-energy ion beams", Thin Solid Films 459, p. 100-105 (2004).

E. N. Glezer et al., "3-D Optical Storage Inside Transparent Materials", *Optics Letters*, vol. 21, No. 24, pp. 2023-2025 (1996).

Eli N. Glezer, "Ultrafast Electronic and Structural Dynamics in Solids", *Thesis for Harvard University The Graduate School of Arts and Sciences*, (Sep. 1996).

R. T. Hilton et al., "Glass wafer processing and inspection for qualification of reticles in a fineline wafer stepper production facility", *SPIE*, vol. 538 Optical Microlithography IV, pp. 117-121 (1985).

Hirao, "Development of Photonics Glass", vol. 30, No. 8, pp. 689-693 (1995).

S.J. Hoskins, "Aspheric surface figuring of fused silica plasma assisted chemical etching", SPIE vol. 2542, Optomechanical and Precision Instrument Design, p. 220-230 (1995).

Harry J. Levinson, "12.2 Extreme ultraviolet lithography—EUV", *Principles of Lithography*, Published by SPIE—The International Society for Optical Enginerring, pp. 382-392 (2005).

Sergey Oshemkov et al., "DUV Attenuating Structures in fused silica induced by ultrafast laser radiation", *Proc. CLEOE-IQUC*, Munich 2007).

Rainer Pforr et al., "Performance comparison of techniques for intrafield CD control improvement", *BACUS* (2007).

Y. Shimotsuma et al., "Nano-modification inside transparent materials by femtosecond pulse laser", Mod. Phys. Lett. B, vol. 19, No. 5, p. 225-238, (2005).

Yasuhiko Shimotsuma et al., "Nanofabrication in transparent materials with a femtosecond pulse laser", *Journal of Non-Crystalline Solids* No. 352, pp. 646-656 (2006).

Yasuhiko Shimotsuma et al., "Self-Organized Nanogratings in Glass Irradiated by Ultrashort Light Pulses", *Physical Review Letters*, vol. 91, No. 24, pp. 247405-1-247405-4 (Dec. 12, 2003).

Linards Skuja et al., "Laser-induced color centers in silica", *SPIE*, vol. 4347, pp. 155-168 (2001).

Alexander M. Streltsov et al., "Fabrication and analysis of a directional coupler written in glass by nanojoule femtosecond laser pulses", *Optics Letters*, vol. 26, No. 1, pp. 42-43 (Jan. 1, 2001).

John S. Taylor et al., "Specification, Fabrication, Testing, and Mounting of EUVL Optical Substrates", *EUV Lithography, SPIE Press Monograph*, vol. PM178, pp. 161-185 (2008).

R. S. Taylor et al., "Femtosecond laser erasing and rewriting of self-organized planar nanocracks in fused silica glass", *Optics Letters*, vol. 32, No. 19, pp. 2888-2890 (Oct. 1, 2007).

Robert A. Jones, "Selected Papers on Computer-Controlled Optical Surfacing", *SPIE Optical Engineering Press*, Bellingham Washington, pp. 206-215 (1991)—J.W. Bender et al., "Computer-controlled belt polishing of diamond-turned annular mirrors" Reprinted from Advances in Fabrication and Metrology for Optics and Large Optics, Proc. SPIE vol. 966, pp. 29-38 (1988).

Robert A. Jones, "Selected Papers on Computer-Controlled Optical Surfacing", *SPIE Optical Engineering Press*, Bellingham Washington, pp. 69-73 (1991)—A.P. Bogdanov, "Optimizing the technological process of automated grinding and polishing of high-precision large optical elements with a small tool", Reprinted with permission from Soviet Journal of Optical Technology, vol. 52(7), pp. 409-413 (Jul. 1985).

Robert A. Jones, "Selected Papers on Computer-Controlled Optical Surfacing", *SPIE Optical Engineering Press*, Bellingham Washington, pp. 97-102 (1991)—Gordon Doughty et al., "Microcomputer-controlled polishing machine for very smooth and deep aspherical surfaces", Reprinted with permission from Applied Optics, vol. 26(12), pp. 2421-2426 (Jun. 15, 1987).

Robert A. Jones, "Selected Papers on Computer-Controlled Optical Surfacing", *SPIE OpticalEngineering Press*, Bellingham Washington, pp. 216-219 (1991)—Greg Hull-Allen et al., "A Computer-Controlled Polisher for Advanced Fabrication", Reprinted with permission from Photonics Spectra, pp. 147—(Mar. 1990).

Robert A. Jones, "Selected Papers on Computer-Controlled Optical Surfacing", *SPIE Optical Engineering Press*, Bellingham Washington, pp. 171-176 (1991)—Robert A. Jones et al., "Automated cylindrical polishing of grazing incidence x-ray mirrors" Reprinted from Optical Engineering, vol. 21(6), pp. 1051-1056 (Nov./Dec. 1982).

Robert A. Jones, "Selected Papers on Computer-Controlled Optical Surfacing", *SPIE Optical Engineering Press*, Bellingham Washington, pp. 91-96 (1991)—Robert A. Jones et al., "Computer-controlled optical surfacing with orbital tool motion", Reprinted from Optical Engineering, vol. 25(6), pp. 785-790 (Jun. 1986).

Robert A. Jones, "Selected Papers on Computer-Controlled Optical Surfacing", *SPIE Optical Engineering* Press, Bellingham Washington, pp. 32-35 (1991)—Robert A. Jones, "Grinding and polishing with small tools under computer conrtol", Reprinted from Optical Engineering, vol. 18(4), pp. 390-393 (Jul./Aug. 1979).

Robert A. Jones, "Selected Papers on Computer-Controlled Optical Surfacing", *SPIE Optical Engineering* Press, Bellingham Washington, pp. 65-68 (1991)—A.S. Savel'ev et al., "Automated polishing of large optical components with a small tool", Reprinted with permission from Soviet Journal of Optical Technology, vol. 52(5), pp. 294-297 (May 1985).

(56) References Cited

OTHER PUBLICATIONS

Robert A. Jones, "Selected Papers on Computer-Controlled Optical Surfacing", SPIE Optical Engineering Press, Bellingham Washington, pp. 191-200 (1991)—Roger J. Thomas et al., "Computer controlled polishing and testing of a glancing incidence telescope", Reprinted with permission of *Applied Optics,* vol. 25(16), pp. 2835-2844 (Aug. 15, 1986).

John S. Taylor et al., "Fabrication and Testing of Aspheres (TOPS)" vol. XXIV, *Optical Society of America,* Washington D.C., pp. 165-168 (1999)—James H. Burge, "Simulation and optimization for a computer-controlled large-tool polisher".

John S. Taylor et al., "Fabrication and Testing of Aspheres (TOPS)" vol. XXIV, *Optical Society of America,* Washington D.C., pp. 187-192 (1999)—H.M. Martin et al., "Fabrication of 6.5 m f/1.25 Mirrors for the MMT and Magellan Telescopes".

\* cited by examiner

Fig. 4
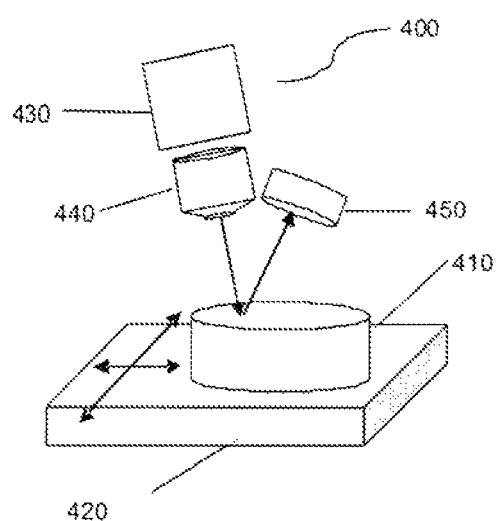
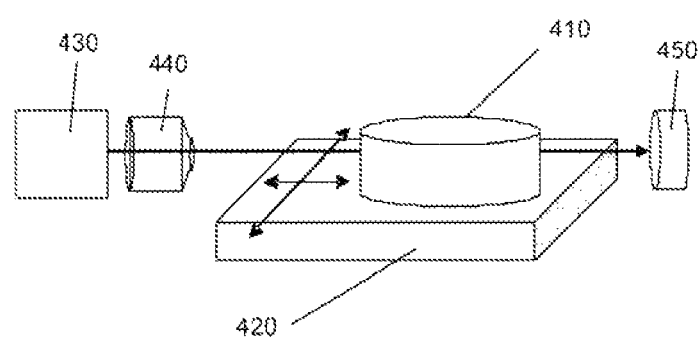

METHOD AND APPARATUS FOR MODIFYING A SUBSTRATE SURFACE OF A PHOTOLITHOGRAPHIC MASK

CROSS REFERENCE TO RELATED APPLICATIONS

Pursuant to 35 U.S.C. §119, this application claims the benefit of prior U.S. provisional application 61/324,467, filed Apr. 15, 2010. The contents of the prior application is incorporated herein by reference in its entirety.

TECHNICAL FIELD

The present disclosure relates to the field of modifying a substrate surface of a photolithographic mask.

BACKGROUND

As a result of the constantly increasing integration density in the semiconductor industry, photolithographic masks have to project smaller and smaller structures. In order to fulfill this demand, the exposure wavelength of photolithographic masks has been shifted from the near ultraviolet across the mean ultraviolet into the far ultraviolet region of the electromagnetic spectrum. Presently, a wavelength of 193 nm is typically used for the exposure of the photoresist on wafers. As a consequence, the manufacturing of photolithographic masks with increasing resolution is becoming more and more complex, and thus more and more expensive as well. In order to use significantly smaller wavelength lithography system for the extreme ultraviolet (EUV) wavelength range (approximately 13.5 nm) are presently in development.

Photolithographic masks have to fulfill highest demands with respect to transmission, planarity, pureness and temperature stability. In particular, the surface of reflective masks for EUV radiation coated with the reflective structure has to be plane within the range of about 1 nm in order to avoid aberrations of the desired structure in the photoresist of the wafer. These challenges also apply for other EUV reflective optical elements e.g. mirrors used in the beam path of EUV lithography (EUVL) systems.

Well known methods exist for the final precision polishing of the optical surfaces (J. S. Taylor and R. Soufti: "Specification, fabrication, testing, and mounting of EUVL optical substrates", in EUV Lithography, SPIE Press Monograph, Vol. PM178, Ed.: Vivek Bakshi, 2008, p. 702). Further, for correcting aberration errors based on material removal well known methods are small tool polishing (J. S. Taylor, M. Piscotty, and A. Lindquist, Eds., "Fabrication and testing of aspheres, trends in optics and photonics (TOPS)", Vol. XXIV, Optical Society of America, Washington D.C. (1999) and R. A. Jones, Ed., "Selected papers on computer controlled optical surfacing", Vol. MS40, SPIE Press, Bellingham, Wash. (1991), ion beam figuring (F. Frost, R. Fechner, B. Ziberi, D. Flamm, and A. Schindler, "Large area smoothing of optical surfaces by low-energy ion beams", Thin Solid Films 459, p. 100-105 (2004) and L. N. Allen and R. E. Keim, "An ion figuring system for large optics fabrication", Proc. SPIE 1168, p. 33-50 (1989)) and plasma-assisted surface etching (S. J. Hoskins, "Aspheric surface figuring of fused silica plasma assisted chemical etching", SPIE Vol. 2542, Optomechanical and Precision Instrument Design, p. 220-230 (1995) and the U.S. Pat. No. 6,858,537 B2).

The U.S. Pat. No. 6,844,272 B2 describes drawbacks of the methods mentioned above.

Several patents disclose various methods for controllable deformation of surface of solid material trying to overcome drawbacks mentioned above, which are described hereinafter.

The above mentioned U.S. Pat. No. 6,844,272 B2 discloses a method and apparatus for figure error correction on optical or other precision surfaces by changing the local density of material in a zone at or near the surface.

The U.S. Pat. No. 6,844,272 B2 gives the graph of the Mo/Si bilayer thickness dependence on the annealing temperature as an example for the implementation of the disclosed method. Excimer laser radiation may be applied for localized energy deposition into the predetermined region. Unfortunately, the invention does not disclose the way of laser radiation implementation, such as pulse width, pulse energy, focusing conditions, etc.

The very similar idea for repairing defects in a multilayer coating layered onto a reticle blank used in an EUVL system is described in United States patent with U.S. Pat. No. 6,821,682 B2.

The feasibility of the idea is illustrated by heating the Mo/Si multilayer with electron beam. However, electron beam implementation needs high vacuum conditions and has low throughput.

The idea of using laser radiation for aberration corrections of optical elements installed in the system is disclosed in U.S. Pat. No. 7,352,452 B2. This document is based on the known effect of compaction of some optical materials (for example—fused silica) under UV radiation (cf. e.g. U.S. Pat. No. 6,205,818 B1). The drawback of the U.S. Pat. No. 7,352,452 B2 is that some optical materials used in EUVL (for example, ZERODUR®) are not transparent for UV radiation, so the method can not be used for aberration corrections of reflective optical elements made of those materials. Another drawback of the invention is low throughput.

The US 2007/0224522 A1 describes a method for flattening a concave or convex substrate of an EUV substrate of a photolithographic mask by generating expanded portions at the corresponding positions of the substrate using a ultrashort pulse laser system. The US 2008/0032206 A1 discloses both the formation of a plurality of expansion stress generation portions and contraction stress generation portions again using an ultrashort pulse laser system. The expansion stress generation portions are generated using pulse durations in the range of 1 µs, whereas the contraction stress generation portions are formulated using laser pulses in the picosecond range. Both, expansion stress generation portions and contraction stress generation portions induce binding modification of the quartz lattice. However, this document does not disclose which processes occur in the stress generation portions. Therefore, it is not clear whether the expansion and contraction stress generation portions are temporally stable or whether the stress generation portions may damage the lattice.

The method of controllable bending of the surface of solid material based on the focusing of femtosecond laser pulses on the surface is described by P. Bechtold and M. Schmidt, "Non-thermal micro adjustment using ultrashort laser pulses", JLMN-Journal of Laser Micro/Nanoengineering, Vol. 2, No. 3 p. 183-188 (2007). This paper considers two options. One option includes the ablation of pre-stressed coatings from a substrate, thus releasing the stress and producing the bending. Another option comprises micro-shockwaves inducing into the material with high-energy ultrashort laser pulses. After rapid transformation of the shock wave to the wave of compression they induce near-surface plastic deformation which results in bending of the surface.

Another approach for the modification of transparent dielectric materials includes focusing of ultrashort femtosecond laser pulses inside the material. Focusing the beam keeps its intensity below the damage threshold at the surface, but concentrates it enough at the focal point inside the material to cause multiphoton/avalanche ionization and structural changes of the material. In this case, near IR (infrared) (typically at about 800 nm or 1.06 μm) focused radiation is used to produce modified fields inside transparent material.

During last years this approach was used for three-dimensional data storage (E. N. Glezer, M. Milosavljevic, L. Huang, R. J. Finlay, T. H. Her, J. P. Gallan, and E. Mazur, "Three-dimensional optical storage inside transparent materials", Opt. Lett., Vol. 21, No. 24, p. 2023-2025 (1996), direct writing waveguides in transparent media (M. Ams, G. D. Marshall, P. Dekker, M. Dubov, V. M. Mezentsev, I. Bennion, and M. J. Withford, "Investigation of ultrashort laser-phonic material interaction: Challenges for directly written glass photonics", IEEE J. of selected topics in quantum electronics, Vol. 14, No. 5, September/October 2008, p. 1370-1379), waveguide couplers writing (A. M. Streltsov and N. F. Borrelli, "Fabrication and analysis of a directional coupler written in glass by nanojoule femtosecond laser pulses", Opt. Lett., Vol. 26, No. 1, p. 42-43 (2001)), and nanogratings producing (Y. Shimotsuma, P. G. Kazansky, J. R. Qiu, and K. Hirao, "Self-organized nanogratings in glass irradiated by ultrashort light pulses", Phys. Rev. Lett., Vol. 91, No. 24, p. 24705-1-247405-4, (2003), Y Shimotsuma et al., "Nano-modification inside transparent materials by femtosecond pulse laser", Mod. Phys. Lett. B, Vol. 19, No. 5, p. 225-238, (2005), and R. S. Taylor, C. Hnatovsky, E. Simova, P. P. Rajeev, D. M. Rayner, and P. B. Corkum, "Femtosecond laser erasing and rewriting of self-organized planar nanocracks in fused silica glass", Opt. Lett. B, Vol. 32, No. 19, p. 2888-2890, (2007)).

Non-linear photoionization of glasses leads also to the creation of laser-induced color centers. Color centers formation in fused silica and corresponding absorption spectra from DUV (deep ultraviolet) to near IR range are described by L. Skuja, H. Hosono, M. Hirano, "Laser-induced color centers in silica", Proc. SPIE, Vol. 4347, p. 155-167 (2001). DUV attenuation was observed in the fields of modified fused silica, which were generated by ultrashort laser pulses at fluence below the threshold of laser-induced breakdown (S. Oshemkov, V. Dmitriev, E. Zait, and G. Ben-Zvi, "DUV attenuating structures in fused silica induced by ultrafast laser radiation", Proc. CLEOE-IQEC, Munich 2007).

Summarizing the discussion of this section, there are some development efforts to understand the processes of non-linear photoionization in transparent dielectrics. However, presently there is no reliable and well understood method of using electromagnetic radiation for "polishing" optical surfaces in a controlled manner.

It is therefore one object of the present invention to provide a method and an apparatus for modifying a surface of a substrate of an EUV photolithographic mask that at least partially avoids the above-mentioned disadvantages.

SUMMARY

According to a first aspect a method of modifying a surface of a substrate of a photolithographic mask for extreme ultraviolet radiation is disclosed herein. The method comprises the step of focusing femtosecond light pulses of a laser system onto the substrate so that a plurality of color centers is generated inside the substrate, wherein the color centers are distributed to cause a modification of the substrate surface.

The inventors have found that in a non-linear photoionization process using excitation conditions which avoid optical breakdown of the substrate simultaneously with the formation of color centers a change of the height of the substrate surface on a nanometer scale occurs. Further, the inventors have found that there exists a strong correlation between the amount of absorption caused by generated color centers and the height of the substrate surface change.

This phenomenon can be physically explained as follows: The formulation of color centers in transparent materials as e.g. in the substrate of EUV photolithographic masks is connected with structural changes of the substrate, which leads to a localized densification or compaction of the substrate in the irradiated area. In this area, stress appears. This stress causes a modification of the height of the substrate surface.

The method disclosed herein has several advantages. The light pulses of a laser beam can be focused on a focal point having a spot diameter of essentially 1 μm. Consequently, the spatial resolution of the method of claim 1 is also in this range. As the femtosecond light pulses are extremely short, the method of claim 1 achieves a high processing throughput, which results in scanning an area of approximately 1 $cm^2$ per minute. In contrast to methods using an electron beam or an ion beam, the method disclosed herein does not need high vacuum and clean room facilities.

A benefit of the defined method is to enable measurements of the induced surface deformations in real time. This is achieved by investigating the distribution of the generated color centers by measuring their absorption in simple transmission loss experiments. Therefore, the method disclosed herein can be used for fast corrections of substrates for reflective optical elements for waviness errors or flatness imperfections of the substrate in a broad range of spatial scales.

The method can be used to modify both surfaces of the substrate of a photolithographic mask, the front surface substrate and/or the rear surface substrate. It is a further advantage of the defined method that both the modifications of the front and the rear substrate surface can be performed by focusing the femtosecond light pulses of a laser system through only one of the substrate surfaces. Presently, the femtosecond light pulses focused into the substrate preferably enter through the rear substrate surface in order to modify the front substrate surface of the photolithographic mask.

According to a further aspect, one object of the present application is solved by a method for compaction of a boundary layer of a substrate of a photolithographic mask for extreme ultraviolet radiation comprising the step of focusing femtosecond light pulses in the boundary layer from a rear substrate surface opposite to a front substrate surface so that a plurality of color centers is generated in the boundary layer, wherein the substrate comprises a front substrate surface with a multi-layer mirror structure.

It is already known that DUV (deep ultraviolet) radiation induces radiation damages in the photolithographic mask leading of a compaction of the mask (cf. U.S. Pat. No. 6,844, 272 B2, col. 5, l. 27-28). This problem will be even more serious for photolithographic masks for the EUV wavelength range. At the same time, the tolerances which do not induce aberrations of the photolithographic mask will decrease. The above method for compaction of a boundary layer can avoid this problem. The layer of the substrate of the photolithographic mask which is hit by EUV radiation is already compacted prior to the application of the mask, so that the EUV radiation can not introduce uncontrollable aberrations due to small deviations of the mask dimensions from predetermined dimensions.

Further, it should be noted that the method of compaction of a boundary layer adjacent to a substrate surface layer and the method of modifying a substrate surface can be combined. For example, the imperfections of the substrate surface adjacent to the boundary layer are removed in a first step and then the boundary layer is compacted so that EUV radiation cannot introduce imperfections during the operation.

According to another aspect, one object of the present application is solved by a method for correcting a substrate surface of a photolithographic mask for extreme ultraviolet radiation, comprising the steps of analyzing the substrate surface, focusing light pulses of a laser system onto positions in the substrate where the substrate height is below a predetermined substrate height so that energy exceeding a threshold of optical breakdown is deposited at these positions, and focusing femtosecond light pulses of the laser system onto positions in the substrate where the substrate height exceeds the predetermined substrate height so that a plurality of color centers are generated at these positions.

In the optical breakdown the substrate material is locally melted and microcracks are always formed due to high local stress inducing local damage in the substrate of the photolithographic mask. In contrast at the color center generation no microcracks or local damage of the substrate occurs. The combination between both modes depends on the substrate material, the pulse duration, the repetition range and the details of the focusing conditions.

The above defined method combines the variation of the height of a substrate surface in both directions i.e. increasing and decreasing of the height. After having determined the imperfections of a photolithographic mask, it can be decided on an individual basis of each mask how to apply the defined method of the two method steps.

In a further aspect disclosed herein for modification of at least a portion of a substrate surface of a photolithographic mask for extreme ultraviolet radiation is provided, comprising at least one light source for generating light pulses of variable pulse duration, repetition rate and energy, at least one objective for focusing light pulses of a light beam, and at least one scanning unit for scanning the light beam across the substrate surface, wherein the pulse duration, the repetition rate, the energy and/or the focusing are selected such that color centers are generated in the portion of the substrate.

The apparatus defined above comprises essentially conventional components. Furthermore, in contrast to electron or ion beam systems, it can operate at atmospheric conditions. Consequently, it may be operated cost-efficiently. Moreover, it has a high throughput as it uses extremely short and high repetition rate light pulses. Furthermore, the loading times of electron and ion beam systems are avoided.

In still another aspect, one object of the present application is solved by a photolithographic mask for extreme ultraviolet radiation, comprising at least one substrate having at least one multi-layer structure and an absorbing structure on a first side, and at least one transparent conductive coating on a second side of the substrate opposite to the first side.

The substrates of EUV photolithographic masks as supplied by the manufacturers may have deviations of its flatness which are already much higher than can be the tolerated for EUV photolithographic masks in order to avoid aberrations. The manufacturing process of the photolithographic mask may impair this situation. In order to have a yield required for an economical process, the front substrate surface has to be flat within a range of essentially 1 nanometer in order to avoid aberrations generated by the mask. The rear substrate surface of photolithographic masks is typically coated with a metal coating, typically with a chromium layer. Consequently, the methods defined above cannot be applied for the corrections of flatness imperfections of the front substrate surface and/or the multi-layer mirror system at the end of the manufacturing process since the light pulses can neither penetrate the metal coating nor the multi-layer mirror structure. Replacing the metal coating at the rear substrate surface by a transparent conductive coating for the wavelength of the processing laser changes the situation. The methods defined above can now be applied to correct imperfections of the front substrate surface and/or the multi-layer mirror system of EUV photolithographic masks.

According to a further aspect a mirror for extreme ultraviolet radiation is provided, comprising at least one substrate having at least one multi-layer structure on a first side, and at least one transparent conductive coating on a second side of the substrate opposite to the first side.

Finally, in yet another aspect, the application concerns an apparatus for modification of at least a portion of a substrate surface of a photolithographic mask for extreme ultraviolet radiation, comprising means for generating light pulses of variable pulse duration, repetition rate and energy, means for directing and focusing light pulses of a light beam, and means for scanning the light beam across the substrate surface, wherein the pulse duration, the repetition rate, the energy and the focusing are selected such that color centers are generated in the portion of the substrate.

Further aspects, embodiments, and advantages follow.

DESCRIPTION OF DRAWINGS

In order to better understand the present disclosure and to appreciate its practical applications, the following Figures are provided and referenced hereafter. It should be noted that the Figures are given as examples only and in no way limit the scope of the invention, which are set forth in the claims.

FIG. 4 schematically depicts a block diagram of an apparatus for determining the absorption of a substrate of an EUV photolithographic mask;

DETAILED DESCRIPTION

In the following, the present invention will now be described more fully hereinafter with reference to the accompanying figures, in which exemplary embodiments of the invention are illustrated. However, the present invention may be embodied in different forms and should not be construed as limited to the embodiments set forth herein. Rather, these embodiments are provided so that this disclosure will be thorough and will convey the scope of the invention to persons skilled in the art.

Figure 1:
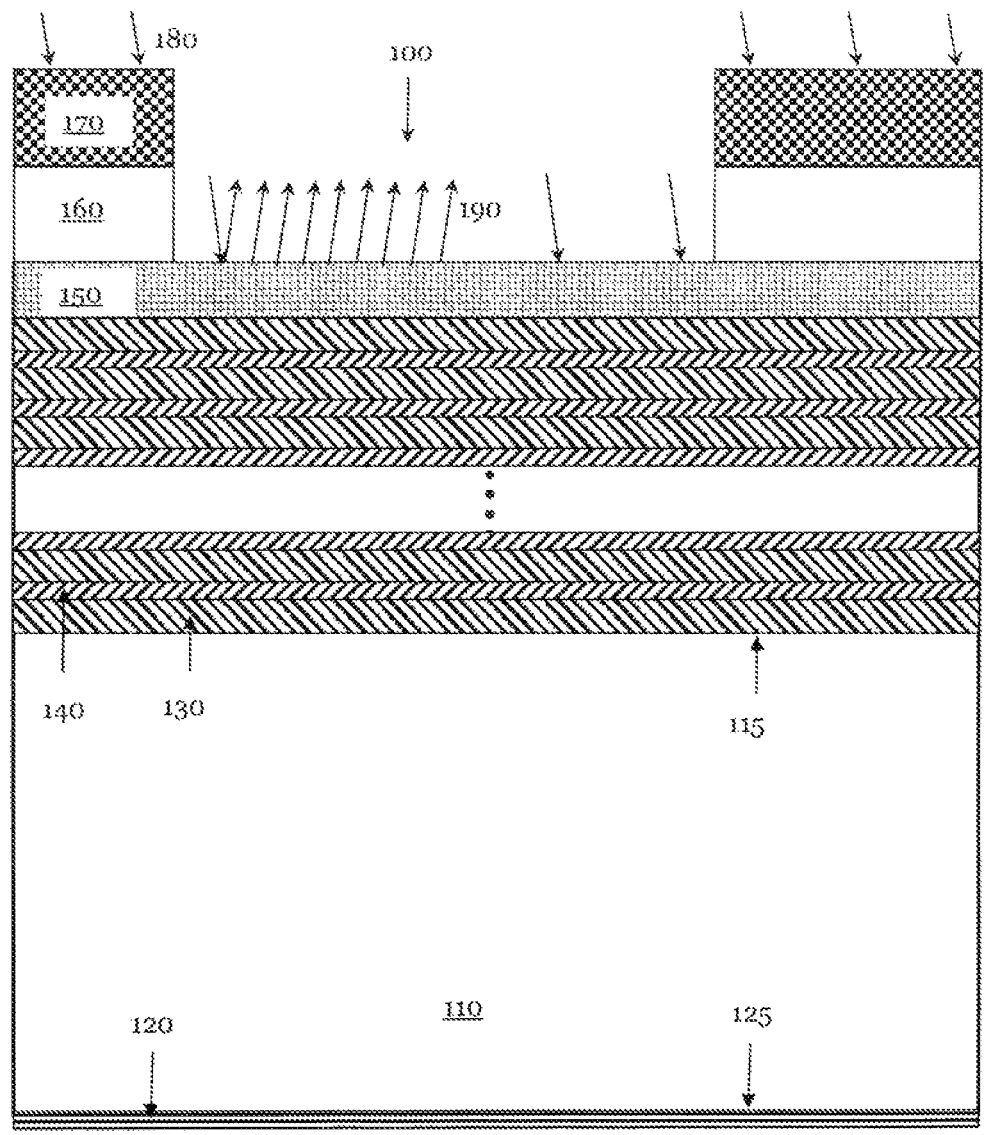
FIG. 1 shows in cross-section a schematic view of an EUV photolithographic mask.

FIG. 1 shows a schematic cross-sectional view of a photolithographic mask 100 for an exposure wavelength of 13.5 nm. Different from presently applied photolithographic masks, the mask 100 is a reflective optical element based on a multi-layer mirror structure. The multi-layer mirror system of photolithographic mask 100 is deposited on a front substrate surface 115 of a suitable substrate 110, such as fused silica substrate. Other transparent dielectrics, glass materials or semiconducting materials may also be applied as substrates for photolithographic masks as for example ZERODUR®, ULE® or CLEARCERAM®.

The multi-layer mirror system comprises 40 pairs of alternating molybdenum (Mo) 130 and silicon (Si) layers 140 (referred to in the following as MoSi layers). The thickness of each Mo layer 130 is 4.15 nm and that of the Si layer 140 amounts to 2.80 nm. In order to protect the multi-layer structure, a capping layer 150 of silicon with a native oxide of 7 nm depth is arranged on top of the structure. In the multi-layer mirror system, the Mo layers 130 act as scattering layers, whereas the silicon layers function as separation layers. For the scattering layers instead of Mo other elements with a high Z number may utilized, such as cobalt (Co), nickel (Ni), tungsten (W), rhenium (Re) and iridium (Ir).

The multi-layer structure on the substrate 110 acts a mirror for XUV electromagnetic radiation. In order to become a photolithographic mask 100, a buffer structure 160 and an absorbing structure 170 are additionally deposited on the capping layer 150. The buffer layer 160 may be deposited to protect the multi-layer mirror structure during processing, for example etching or repairing of the absorbing structure 170. Possible buffer structure materials are for example of fused silica ($SiO_2$), silicon-oxygen-nitride (SiON), ruthenium (Ru), chromium (Cr), and/or chromium nitride (CrN). The absorbing structure 170 comprises a material having a large absorption constant for photons in the XUV wavelength range. Examples of these materials are chromium (Cr) and/or tantalum nitride (CrN). A thickness of about 50 nm is sufficient to absorb essentially all XUV photons 180 incident on the absorbing structure 170. In contrast, the majority of the photons 180 incident on the capping layer 150 is reflected as photons 190. In this context as well as on further positions of this description the term "essentially" means a numeric value of a quantity within its measurement limit.

The substrate has typical lateral dimensions of 152 mm×152 mm and a thickness or height of essentially 6.35 mm. The rear surface 125 of the substrate 110 or the rear substrate surface 125 has a thin metallic coating 120. Typically this coating 120 comprises chromium. The metallic coating 120 is used to fix the photolithographic mask 100 at the EUV scanner by the application of electrostatic forces.

In the inventive methods described in the following energy from light pulses of a light beam is locally deposited in the substrate 110 of the photolithographic mask 100. However, the light pulses of the light beam can neither penetrate the front substrate surface 115, as they are absorbed by the multilayer mirror structure, nor the rear substrate surface 125, as they are also absorbed by the metallic coating 120 on the rear substrate surface 125.

Figure 2:
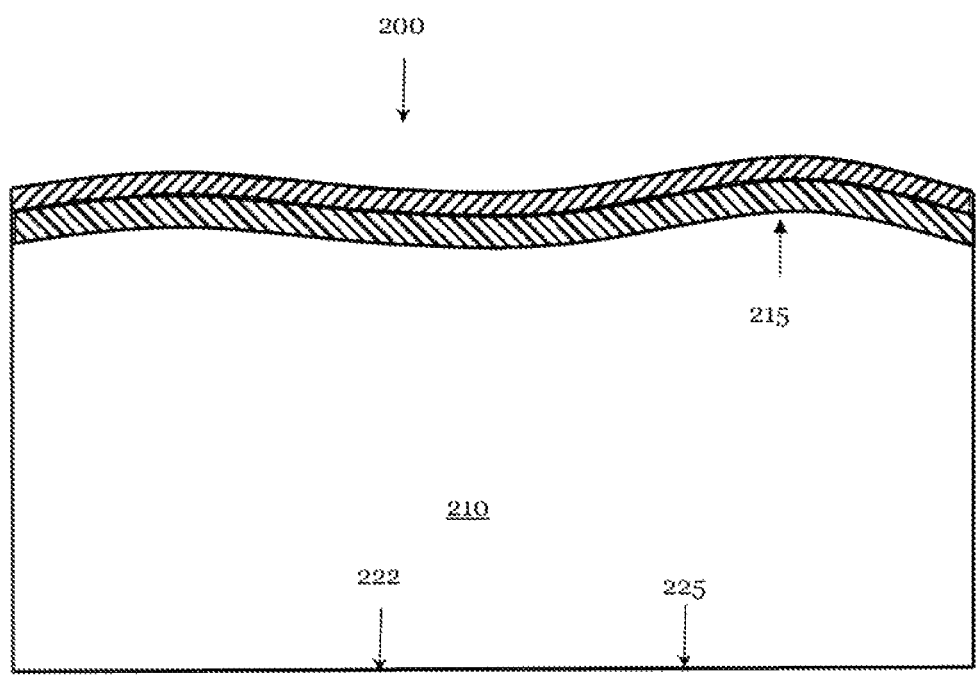
FIG. 2 depicts a schematic representation of a substrate of an EUV photolithographic mask having a transparent conductive coating at the rear substrate surface and an uneven front substrate surface with a single layer of the multi-layer system of FIG. 1.

It is therefore one aspect of the inventive concept to replace the metallic coating 120 on the rear substrate surface 125 of the photolithographic mask 100 by a transparent conductive coating 222, as it is shown in FIG. 2. Such a transparent conductive coating 222 may for example comprise indium tin oxide (ITO). Alternative materials for transparent conductive coatings are for example fluorine tin oxide (FTO) and/or aluminum zinc oxide (AZO) and/or antimony tin oxide (ATO). These materials can easily be applied to the rear substrate surface 125 of a fused silica substrate 110 and have a conductivity which is high enough to fix the photolithographic mask 100 to the EUV scanner. The transparent conductive coating 222 enables to irradiate the completely manufactured photolithographic mask 100 with light pulses of a laser beam through the rear substrate surface 125.

An EUV mirror may have the structure of the photolithographic mask 100 unless it does not have the capping structure 160 and the absorbing structure 170. Therefore, also for an EUV mirror the metallic coating may 120 be replaced by a transparent conductive coating 222, so that the light pulses are able to enter into the substrate from the rear substrate surface.

FIG. 2 shows a substrate 210 of a photolithographic mask 200 where the front substrate surface 215 of the substrate 210 is not flat but has two bumps. A single MoSi layer is arranged on the front substrate surface 215 which reproduces the imperfections of the front substrate surface 215. The further 39 Mo Si layers and the absorbing structure of FIG. 1 have been removed. The further coating of the remaining MoSi layers will typically also reproduce imperfections of the front substrate surface 215. In rare lucky cases the coating of the remaining 39 MoSi layers will smooth the imperfections of the front substrate surface 215, so that the upper layer shows less imperfections than the MoSi layers close to the front substrate surface 215 of the substrate 210 of the photolithographic mask 200. In contrast, there is a much higher probability that coating of the remaining MoSi layers will aggravate the imperfections of the front substrate surface 215.

When fixing the photolithographic mask 200 at an EUV scanner the irregularities of the front substrate surface 215 lead to aberrations compared with the essentially ideal photolithography mask 100. The aberrations caused by the uneven front substrate surface 215 can neither be removed by varying the position of the wafer nor by changing the reproduction scale. As already discussed, deviations from the flatness of the front substrate surface 215 in the range of 1 nanometer are already sufficient to induce aberrations. In contrast to FIG. 1, the photolithographic mask 200 of FIG. 2 has on its rear substrate surface 225 a transparent conductive coating 222 instead of a metal coating 120.

Figure 3:
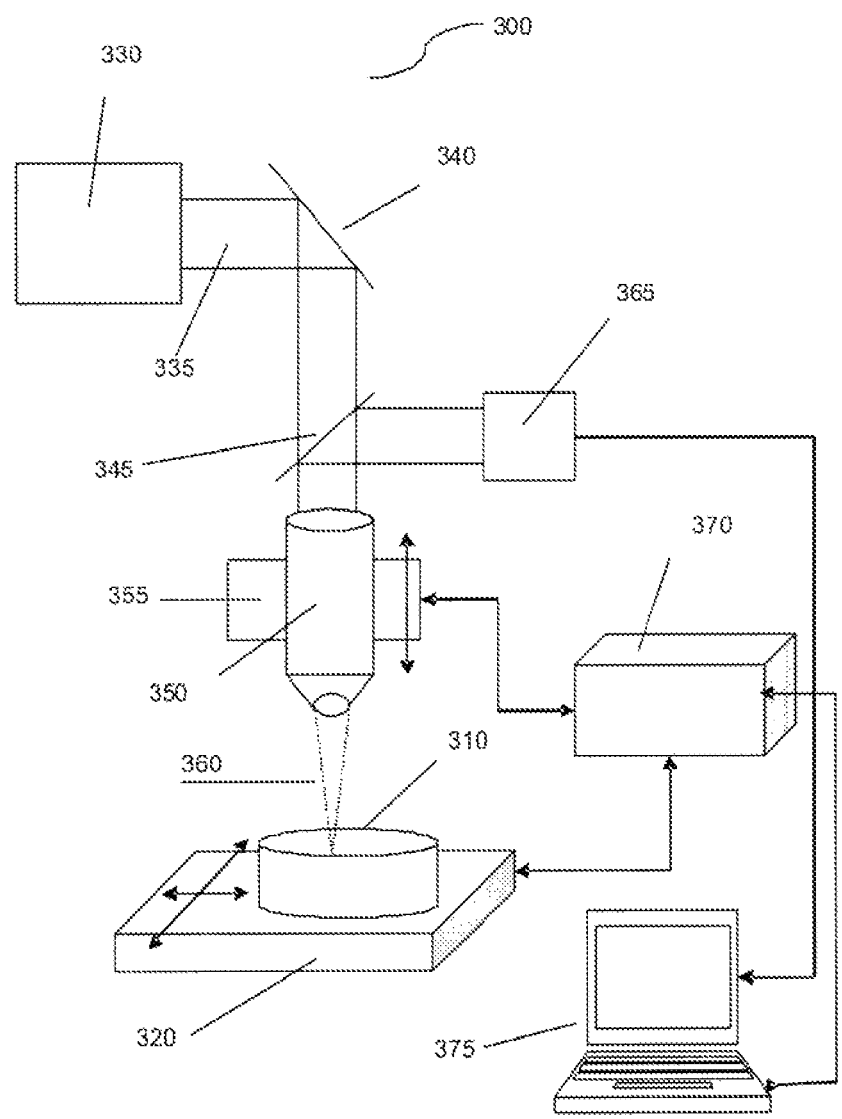
FIG. 3 schematically represents a block diagram of an apparatus for the modification of a substrate surface of an EUV photolithographic mask.

FIG. 3 depicts a schematic block diagram of an apparatus 300 which can be used to correct flatness imperfections of the front substrate surface 215 of the photolithographic mask 200. The apparatus 300 comprises a sample holder 320 which may be movable in three dimensions. The movement of the sample holder 320 in two dimensions in the plane of the sample holder 320 is indicated in FIG. 3 by crossed arrows. The photolithographic mask 310 may be fixed to the sample holder 320 by using various techniques as for example clamping. The photolithographic mask 310 may be the photolithographic mask 200 mounted upside down, so that its rear substrate surface 225 is directed towards the objective 350.

The apparatus 300 includes a pulse laser source 330 which produces a beam or light beam 335 of pulses or light pulses. The laser source 330 generates light pulses of variable duration. The pulse duration may be as low as 10 fs but may also be continuously increased up to 100 ps. The pulse energy of the light pulses generated by the pulsed laser source 330 can also be adjusted across a huge range reaching from 0.01 µJ per pulse up to 10 mJ per pulse. Further, the repetition rate of the light pulses comprises the range from 1 Hz to 100 MHz. In a preferred embodiment the light pulses may be generated by a Ti:Sapphire laser operating at a wavelength of 800 nm. However, the methods described in the following are not limited to this laser type, principally all laser types may be used having a photon energy which is smaller than the band gap to the substrate of the photolithographic mask 310 and which are able to generate pulses with durations in the femtosecond range. Therefore, for example Nd-YAG laser or dye laser systems may also be applied.

The steering mirror 340 directs the pulsed laser beam 335 into the focusing objective 350. The objective 350 focuses the pulsed laser beam 335 through the rear substrate surface into the substrate of the photolithographic mask 310. The NA (numerical aperture) of the applied objectives depends on the predetermined spot size of the focal point and the position of the focal point within the substrate of the photolithographic mask 310 relative to the rear substrate surface. The NA of the objective 350 may be up to 0.9 which results in a focal point spot diameter of essentially 1 µm and a maximum intensity of essentially $10^{20}$ W/cm$^2$.

The apparatus 300 also includes a controller 370 and a computer 375 which manage the translations of the two-axis positioning stage of the sample holder 320 in the plane of (x and y directions). The controller 370 and the computer 375 also control the translation of the objective 350 perpendicular to the plane of the sample holder 320 (z direction) via the one-axis positioning stage 355 to which the objective 350 is fixed. It should be noted that in other embodiments of the apparatus 300 the sample holder 320 may be equipped with a three-axis positioning system in order to move the photolithographic mask 310 to the target location 360 and the objective 350 may be fixed, or the sample holder 320 may be fixed and the objective may be moveable in three dimensions. Although not economical, it is also conceivable to equip both the objective 350 and the sample holder 320 with three-axis positioning systems. It should be noted that a manual positioning stages can also be used for the movement of the photolithographic mask 310 to the target location 360 of the pulsed laser beam 335 in x, y and z directions and/or the objective may have manual positioning stages for a movement in three dimensions.

The computer 375 may be a microprocessor, a general purpose processor, a special purpose processor, a CPU (central processing unit), a GPU (graphic processing unit) or the like. It may be arranged in the controller 370, or may be a separate unit such as a PC (personal computer), a workstation, etc. The computer 375 may further comprise I/O (input/output) units like a keyboard, a touchpad, a mouse, a video/graphic display, a printer, etc. In addition, the computer 375 may also comprise a volatile and/or a non-volatile memory. The computer 375 may be realized in hardware, software, firmware or any combination thereof. Moreover, the computer 375 may control the laser source 330 (not indicated in FIG. 3).

Further, the apparatus 300 may also provide a viewing system including a CCD (charge-coupled device) camera 365 which receives light from an illumination source arranged to the sample holder 320 via the dichroic mirror 345. The viewing system facilitates navigation of the photolithographic mask 310 to the target position 360. Further, the viewing system may also be used to observe the formation of a modified area on the rear substrate surface of the photolithographic mask 310 by the pulse laser beam 335 of the light source 330.

FIG. 4 shows an apparatus 400 used for measuring the transmittance of the substrate of the photolithographic mask 410. The photolithographic mask 410 may again be the photolithographic mask 200 of FIG. 2 mounted upside down on the sample holder 420. The probe source 430 may be any light source from which a wavelength range suitable for the detection of transmittance changes in the substrate of the photolithographic mask 410 can be filtered out. In the embodiment of apparatus 400 a Deuterium lamp is used. It should be noted that the wavelength of the probe light source 430 depends on the material used as substrate for the photolithographic mask 410. The objective 440 directs the light beam of the probe light source 430 onto the substrate of the photolithographic mask 410. The beam of the probe light source 430 may be CW (continuous wave) or may be pulsed. The photodetector 450 can be of any type suitable to detect the radiation of the probe light source 430. The apparatus 400 uses a silicon photodiode as photodetector 450.

FIG. 4 shows schematically in the upper part a configuration of the apparatus 400 in which the probe light source 430 radiates its light through the rear substrate surface of the photolithographic mask 410 similar than pulsed laser source 330. The multi-layer mirror structure on the front substrate surface of the photolithographic mask 410 reflects the beam of the probe light source 430 onto the photodetector 450. This arrangement of the probe system is the presently preferred configuration to measure the absorption of the color centers generated by the pulsed laser source 330. The lower part of FIG. 4 presents an alternative configuration to determine the transmittance change or the attenuation of the light beam of the probe light source 430 induced by the generated color centers. In this configuration the probe light source 430 radiates its light in the plane of the sample holder 420 into the substrate of the photolithographic mask 410.

Color centers generated by the light source 330 of the apparatus 300 absorb photons from the light beam of the probe light source 430. This absorption can be detected by a reduction in the transmittance (attenuation) of the light beam of the probe light source 430 at the photodetector 450 compared to an area or volume having no color centers. The focal point of the light beam of the probe light source 430 should be as small as possible since this quantity limits the spatial resolution of the transmittance change within the substrate of the photolithographic mask 410.

The sample holder 420 is again movable in the plane of the sample holder 420 as indicated by the crossed arrows using a two-axis position state. The optical elements 430, 440 and 450 or at least the probe light source 430 and the objective 440 may be moveable in a direction perpendicular to the plane of the sample holder 420 (not shown in FIG. 4). Alternatively, the optical elements may be fixed and the sample holder 420 may comprise a three-axis positioning stage. In a further embodiment, the sample holder 420 may be fixed and the optical elements 430, 440 and 450 may be moveable in three directions.

Instead of using the transmittance change to detect the distribution of the color centers generated by the pulsed laser source 330 of the apparatus 300, the emission of the excited color centers could also or in addition to the detection of the transmittance change be used to identify the distribution of the generated color centers. For these alternatives a second photodetector may be used which may be arranged in the same plane as the photodetector 450 but may have an angle of for example 90° to the photodetector 450 (not shown in FIG. 4) Alternatively, the photodetector 450 may be rotated by for example 90° without using a second photodetector (also not shown in FIG. 4). In a further embodiment, the second photodetector and/or the photodetector 450 may be arranged outside of the plane of the sample holder 420.

The optical elements 430, 440 and 450 may also be controlled by the controller 370 and/or the computer 375. Further, the apparatus 300 and the apparatus 400 may be combined in a single apparatus. The combined configuration has the advantage that it is not necessary to adjust the photolithographic mask several times to the sample holder.

Figure 5:
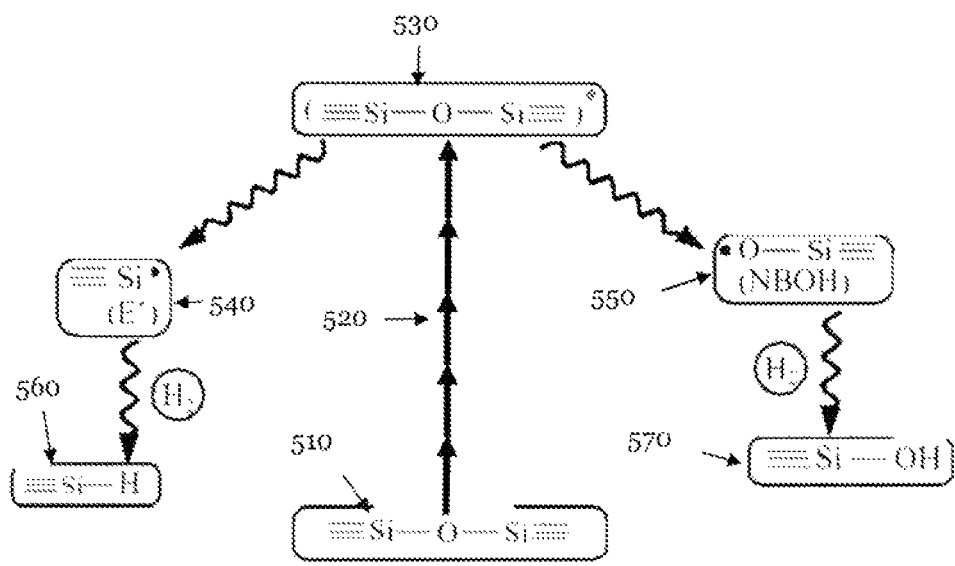
FIG. 5 schematically shows the processes leading to the generation of a color center in a quartz substrate.

The apparatus 300 of FIG. 3 is used to locally generate color centers in the substrate 210 of the photolithographic mask 200 of FIG. 2. FIG. 5 schematically illustrates the essential processes at the generation of color centers using the pulsed laser source 330 of the apparatus 300 at the example of fused silica. The bandgap energy 520 of fused silica between the valence band 510 and the conduction band 530 is about 9 eV. The wavelength of the laser source 330 is essentially 800 nm which corresponds to about 1.5 eV. This means that a single photon of the pulsed laser source 330 can not bridge the energy gap between the valence band 510 and the conduction band 530. Still much less a single photon of the pulsed laser source 330 can break up a bond between a silicon atom and an oxygen atom forming the structure of fused silica of the substrate 210 of the photolithographic mask 200.

The intensity in the focal point of the laser beam is however high enough so that non-linear photoionization processes may occur. One of several non-linear processes is multiphoton ionization, which occurs when a single electron in the valence band 510 of fused silica simultaneously absorbs several photons and thus bridging the gap 520 between the valence band 510 and the conduction band 530 of fused silica.

Another possible option includes self-focusing of the beam and spectral broadening of the high intensity laser pulse (white light generation) which leads to the increase of the single photon energy and to the increase the efficiency of the multiphoton ionization process (O. M. Efimov, K. Gabel, S. V. Gernov, L. B. Glebev, S. Granthman,. Richardson, and M. J. Soioileau, "Color center generation in silicate glasses exposed in infrared femtosecond pulses", J. Opt. Soc. Am., Vol. 15, p. 193-199 (1998)).

In the focal point of an intense light pulse a multitude of electrons are excited from the valence band 510 to the conductor band 530 of fused silica. The excited electrons in the conduction band 530 are also subjected the strong electric field of the laser pulses. The combined interaction of the electrons in the conduction band 530 and the intense electric field of the light pulses can break the bonding of an oxygen atom to one of the silicon atoms. If this occurs, two color centers 540, 550 are generated. In the E' center 540 a hole is trapped in an oxygen vacancy. In the non-bridging oxygen hole center (NBOHC) 550 an oxygen atom has an excessive electron. The excessive electron at the oxygen atom gives raise to strong absorption bands in the UV (ultraviolet) and in the visible wavelength range. The inventive principles of the present application use these absorption bands in order to identify or to detect the generated color centers. Preferably, the absorption band in the visible wavelength range is used as there is a variety of probe light sources and photodetectors in this wavelength range.

In the presence of hydrogen and/or chlorine both color centers 540 and 550 decay by forming a bonding with these elements. The time scale of this decay depends on the concentration of these and/or other impurities, on the temperature, and the illumination conditions in particular the DUV (deep ultraviolet) radiation. At room temperature, the time constant is in the range of ten days. It should be noted that in contrast to conditions of optical breakdown the generation of color centers does not lead to microcracks in the substrate of photolithographic masks.

It should further be noted that the generation of the color centers occurs below the threshold of breakdown which results in a local mechanical damage of the substrate material.

Figure 6:
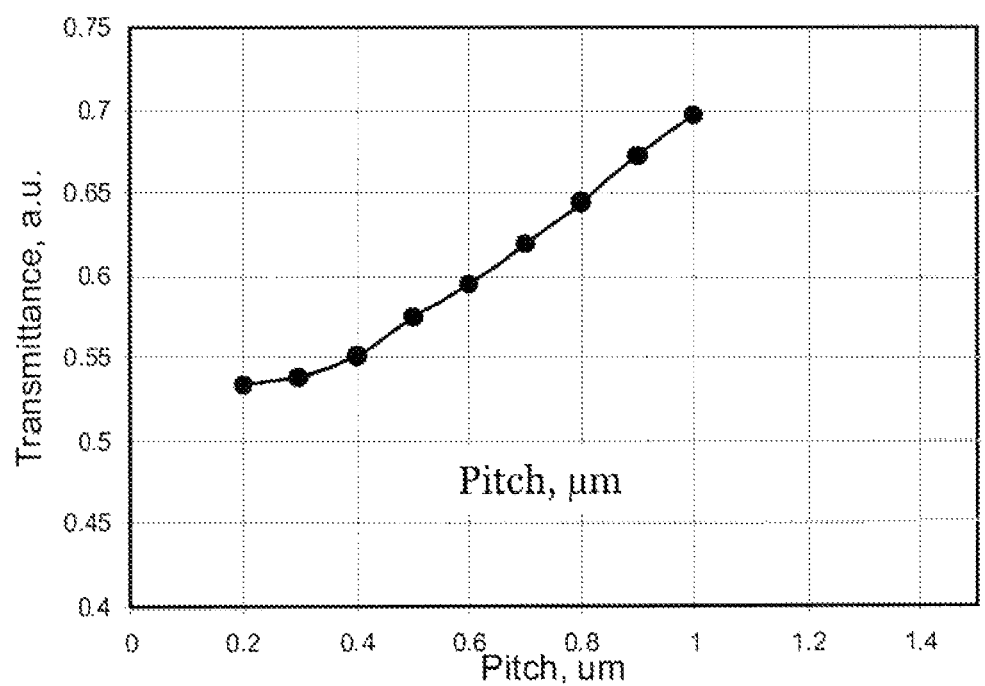
FIG. 6 presents the dependence of the transmittance at a wavelength of 214 nm of a volume of the fused silica substrate scanned with the apparatus of FIG. 3 on the scanning pitch at a pulse energy of 1.5 µJ.

As explained above, the pulsed laser source 330 generates color centers 540, 550 in the substrate 210 of the photolithographic mask 200 mounted on the sample holder 320 of the apparatus 300. By scanning the pulsed laser source 330 across the rear substrate surface 225 of the substrate 200 and by changing the focal point relative to the rear substrate surface 225 color centers may be generated with a predetermined three-dimensional distribution at any position within the substrate 200. At these scans the pitch or the distance between two different strikes of laser pulses on the rear substrate surface 225 of the photolithographic mask 200 mounted upside down on the sample holder 320 of the apparatus 300 can be varied. FIG. 6 presents a curve showing the dependence of the transmittance of fused silica at the wavelength of 214 nm as a function of the pitch determined with the apparatus 400 of FIG. 4. The pulse energy is 1.5 µJ and is identical for all scans. The pulse width or pulse duration is 200 fs at a repetition rate of 100 kHz. This curve shows a liner relationship between the transmittance and the pitch. The curve of FIG. 6 indicates that the larger the distance between the strikes of subsequent laser pulses the less color centers are within the beam path of the probe light source 430, the less the transmitted light is attenuated, since less color centers absorb photons from the beam of the probe light source 430. At very small pitches the transmittance tends to saturate.

Figure 7:
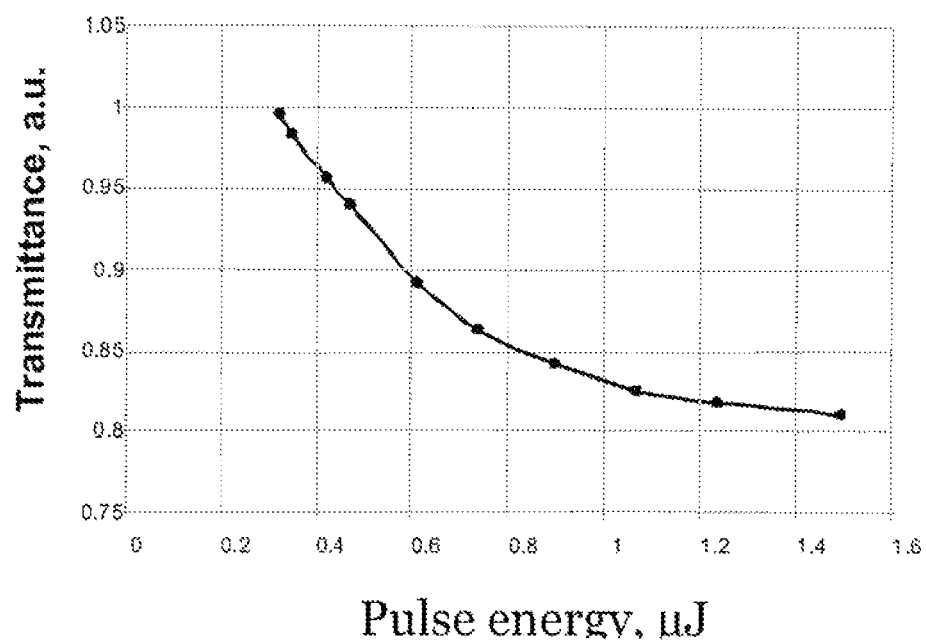
FIG. 7 shows the dependence of the transmittance at a wavelength of 214 nm of a volume of the fused silica substrate on the pulse energy at a pitch of 0.5 µm.

Apart from the pitch, the energy of the light pulses of the pulsed laser source 330 is also an important parameter. FIG. 7 presents the variation of the transmittance as a function of the pulse energy. The pitch is always 0.5 µm. As in FIG. 6, the pulse duration is 200 fs and the repetition rate amounts to 100 kHz. The curve of FIG. 7 shows that the variation of the transmittance increases as a function of the pulse energy. This indicates that the higher the pulse energy of the pulsed laser source 330 the more color centers are generated which absorb photons from the probe light source 430 during the transmittance measurement. FIG. 7 also indicates that there is a threshold for the generation of color centers; in the example of FIG. 7 no color centers are generated below a pulse energy of 0.3 µJ.

Figure 8:
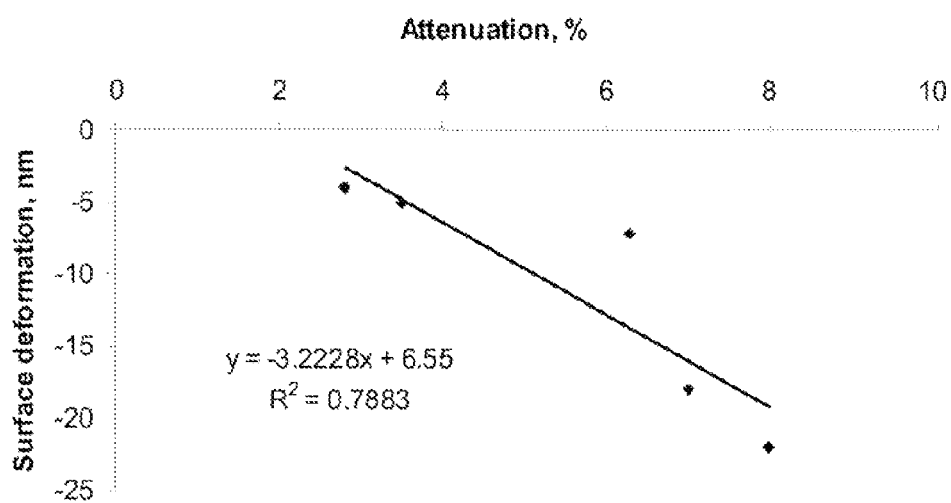
FIG. 8 presents the dependence of a surface deformation on the attenuation of a volume of the fused silica substrate at a distance of 450 µm from the substrate surface.

As already discussed above in the context of FIG. 5, the generation of the color centers 540 and 550 results in the formation of an oxygen vacancy. This oxygen vacancy induces stress in the substrate 210 of the photolithographic mask 200 around the vacancy. FIG. 8 shows the deformations of the front substrate surface 215 of the photolithographic mask 200 as a function of the color center density generated at a depth of 450 µm below the front substrate surface 215 of the substrate 210. The distribution of the color centers are generated with the pulsed laser source 330. The generated color center distribution is probed with the probe light source 430 by measuring the attenuation of the probe light beam in the substrate 210. The attenuation corresponds to the change in the transmittance (1−transmittance).

FIG. 8 depicts a linear relationship between the generated color center density and the surface deformation. The stress induced by the femtosecond light pulses of the pulsed laser source 330 gives rise to a reduction of the height of the rear substrate surface 225 of about 20 nm at an attenuation of about 8% of the light beam of the probe light source 430. A transmittance change or attenuation of the probe light source of about 3% results in a surface height reduction of the front substrate surface 215 of the substrate 210 of approximately 5 nm. This shows that the stress introduced by the generation of color centers results in an increase of the density (compaction) of fused silica around the color centers.

Figure 9:
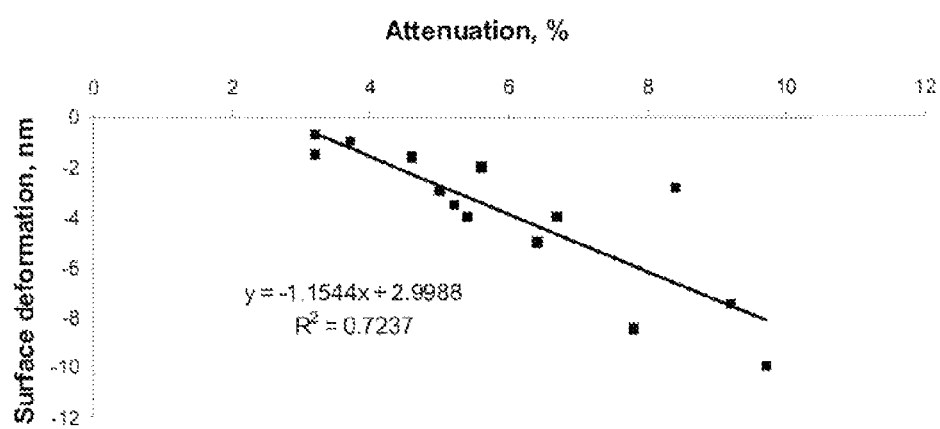
FIG. 9 represents the dependence of a surface deformation on the attenuation of a volume of the fused silica substrate at a distance of 3.7 mm from the substrate surface.

FIG. 9 reproduces the experimental result of FIG. 8 with the difference that the femtosecond light pulses mm generate the color center distribution in a depth of 3.7 mm below the front substrate surface 215 of the substrate 210 of the photolithographic mask 200. The measured data in FIG. 9 indicate again a linear relationship between the color density distribution and the surface height reduction of the front substrate surface 215 of the substrate 210.

The comparison of the results of FIGS. 8 and 9 reveals that a color center distribution having a larger distance to the rear substrate surface 225 induces less surface deformation than a color center distribution generated closer to the rear substrate surface 225. Or in other words, the highest surface modification results from a color center distribution as close as possible to the respective substrate surface.

The front substrate surface 215 of the substrate 210 carries the multi-layer mirror structure of manufactured the photolithographic mask 200. At the correction of the front substrate surface 215 by focusing the femtosecond light pulses through the rear substrate surface 225, the focal point of the femtosecond light pulses has to be adjusted relative the front substrate surface 215 in such a way so that no damage of the multi-layer mirror structure on the front substrate surface 215 will occur.

Figure 10:
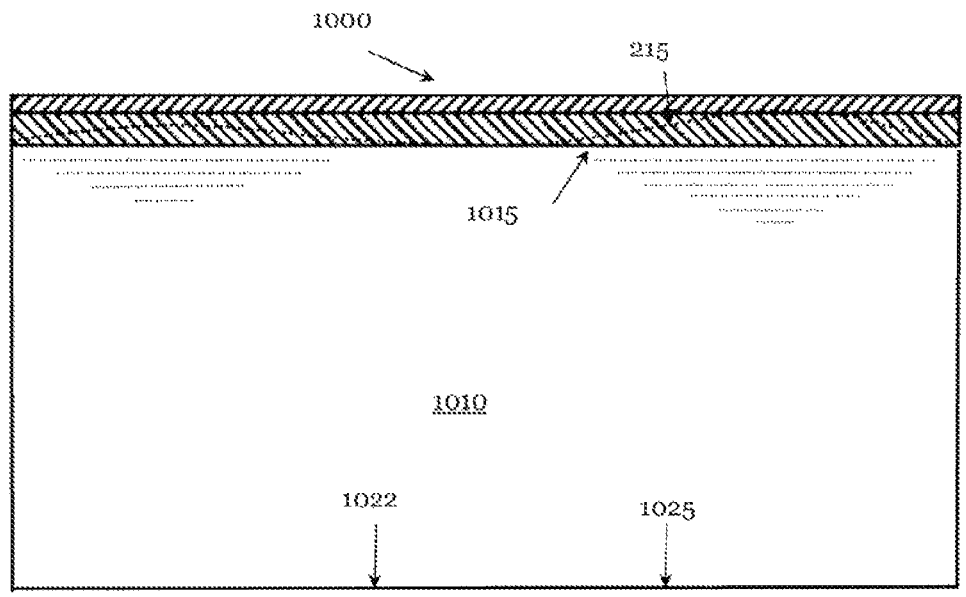
FIG. 10 schematically shows the substrate of FIG. 2 after removal of the flatness imperfections.

FIG. 10 schematically shows the correction of the flatness imperfections of the front substrate surface 215 of photolithographic mask 200. The photolithographic mask 1000 corresponds to the photolithographic mask 200 prior to the application of one of the inventive principles. The rear substrate surface 1025 has a conductive transparent coating 1022. In the substrate 1010 of the photolithographic mask 1000 color centers are generated by scanning focused femtosecond light pulses of the pulsed laser source 330 in planes of various distance from the front substrate surface 1015 across the regions having the bumps, so that the distribution of the generated color centers correlates to the local deviation of the front substrate surface 1015 from the predetermined the front substrate surface 1015. The color center distribution of FIG. 10 is formed using pulses which have a duration of 200 fs and a repetition rate of 100 kHz. The pulse energy is 1.5 µJ at a focal point diameter of 2.5 µm and a pitch of 0.2 µm. The minimum distance of the focal point of the femtosecond light pulses from the front substrate surface 1015 is 400 µm and the distance between the different planes of generated color centers is 100 µm. As indicated in FIG. 10, the generated color center distribution essentially removes the flatness imperfections of the front substrate surface 215 of the photolithographic mask 200.

Figure 11:
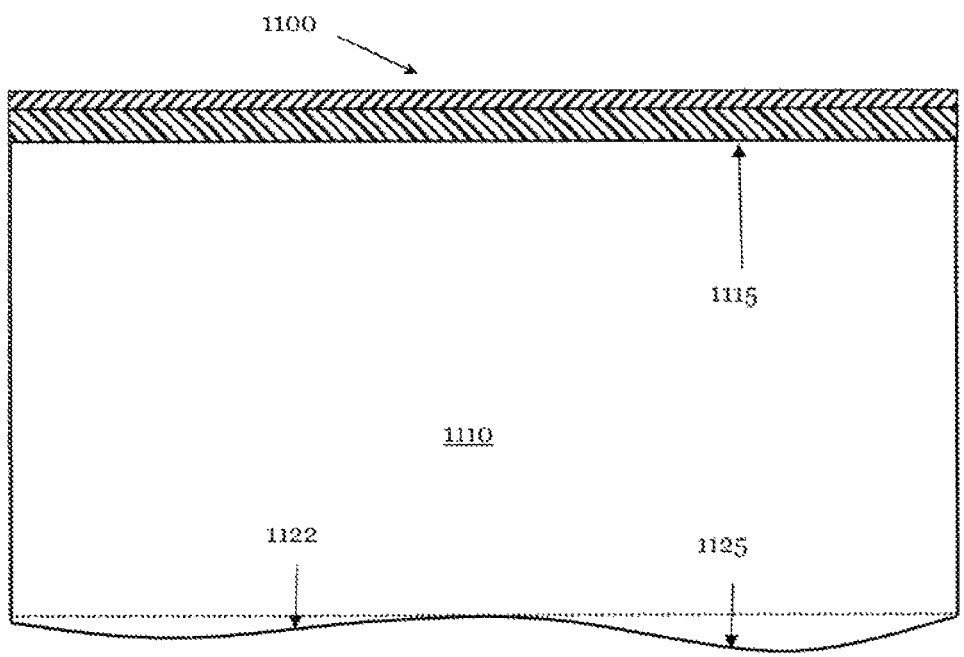
FIG. 11 schematically depicts a substrate of an EUV photolithographic mask with imperfections of the front substrate surface.

FIG. 11 schematically depicts that the generation of a distribution of color centers by the pulsed laser source 330 may also be used to correct imperfections of the front substrate surface 1125 by focusing the light pulses into the substrate 1110 close to the front substrate surface 1125. After the generation of a corresponding distribution of color centers the bumps of the front surface substrate 1125 disappear. As already discussed in the context of FIGS. 3 and 4, the generation of the color center distribution may be carried out in a number of steps controlled by the detection of changes in the transmittance of the probe light source 430 within the substrate 1110 by the photodetector 450, i.e. in a closed feedback loop.

Figure 12:
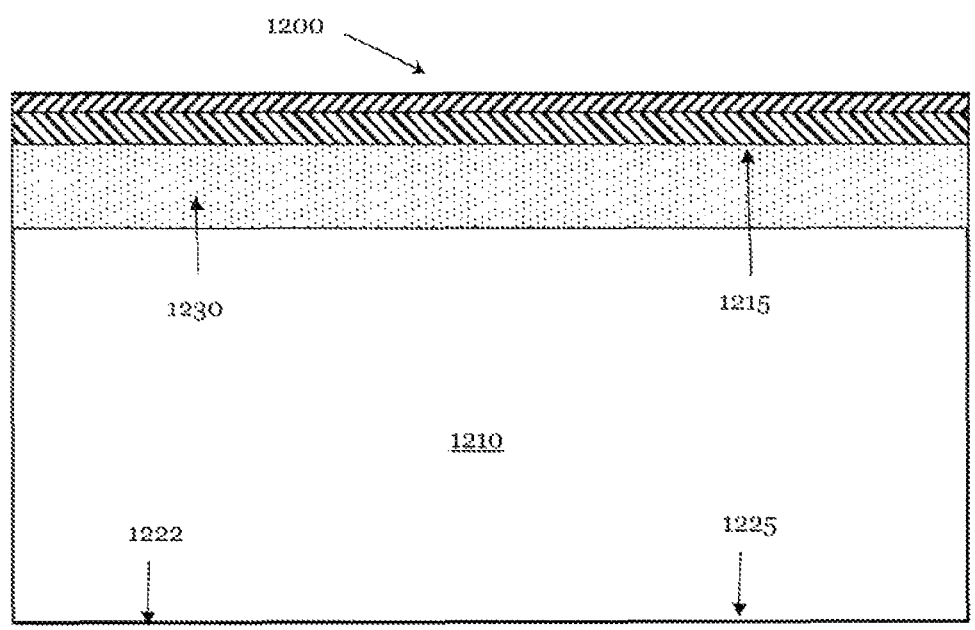
FIG. 12 schematically depicts a substrate of an EUV photolithographic mask with a boundary layer below the front substrate surface, a single MoSi layer and a transparent conductive coating on the rear substrate surface.

FIG. 12 illustrates a further aspect of the present invention. A small fraction of the EUV radiation reflected from the multi-layer mirror structure (MoSi layers) may reach the front substrate surface 1215 of the photolithographic mask 1200. As already discussed in section 3, the EUV radiation may damage the structure of the fused silica a boundary layer 1230 of the substrate 1210 of the photolithographic mask 1200. This process will cause aberrations of the photolithographic mask 1200 during the operation since the dimensions of the multi-layer mirror system of the photolithographic mask 1200 change temporally and locally (not indicated in FIG. 12). This problem can be avoided if the boundary layer 1230 of the substrate of the photolithographic mask 1200 is scanned at the end of the manufacturing process of the photolithographic mask 1200 with the pulsed laser source 330 of the apparatus 300 of FIG. 3. In order to be able to focus the pulsed laser source 330 into the boundary layer 1230 through the rear substrate surface 1225, the rear substrate surface 1225 has to have a transparent conductive coating 1222.

The scan of the light pulses of the pulsed laser source 330 can be repeated in planes having various distances to the front substrate surface 1215, so that the pulsed laser source 330 generates color centers within the boundary layer 1230. Similar to FIG. 10, pulses which have a duration of 200 fs and a repetition rate of 100 kHz are used to generate the compaction layer 1230. The pulse energy is again 1.5 µJ at a focal point diameter of 2.5 µm and a pitch of 0.3 µm. The minimum distance of the focal point of the femtosecond light pulses from the front substrate surface 1215 is again in the range 400 µm and the distance between the different planes of generated color centers is 70 µm. As already discussed in the context of FIG. 6, the distribution of the color centers generated by the femtosecond light pulses of the pulsed laser source 330 should keep a minimum distance to the front substrate surface 1215 in order to avoid damaging of the multi-layer mirror structure on the front substrate surface 1215 (not indicated in FIG. 12). As already described in the context of the discussion of FIGS. 5 to 9, the color centers compact the boundary layer 1230. Therefore the EUV radiation reaching the boundary layer 1230 through the multi-layer mirror structure during operation can no longer damage the lattice of the fused silica of the boundary layer 1230 of the substrate 1210. Consequently, the dimensions of the photolithographic mask 1200 are not changed during its operation and aberrations are avoided.

The three-dimensional distribution of the generated color centers can again be measured with the apparatus 400 of FIG. 4. The color centers may be homogenously distributed within the boundary layer 1230, or their density can diminish with increasing distance from the front substrate surface 1215. Further, the density of the generated color centers may be smaller or may be even zero below the absorbing structure as the probability is very low that EUV photons may penetrate both, the absorbing structure and the subjacent multi-layer mirror structure (cf. FIG. 1).

The methods of correcting the front substrate surface 1215 and of compacting the boundary layer 1230 may be combined. In an embodiment, the front substrate surface 1215 may be corrected in a first step and then the boundary layer 1230 may be compacted by for by example homogeneously generating color centers in the boundary layer 1230. In an alternative approach the sequence of steps may be reversed. In another embodiment, both the modification of the front substrate surface 1215 and compacting the boundary layer 1230 may be performed in one individual operation.

Figure 13:
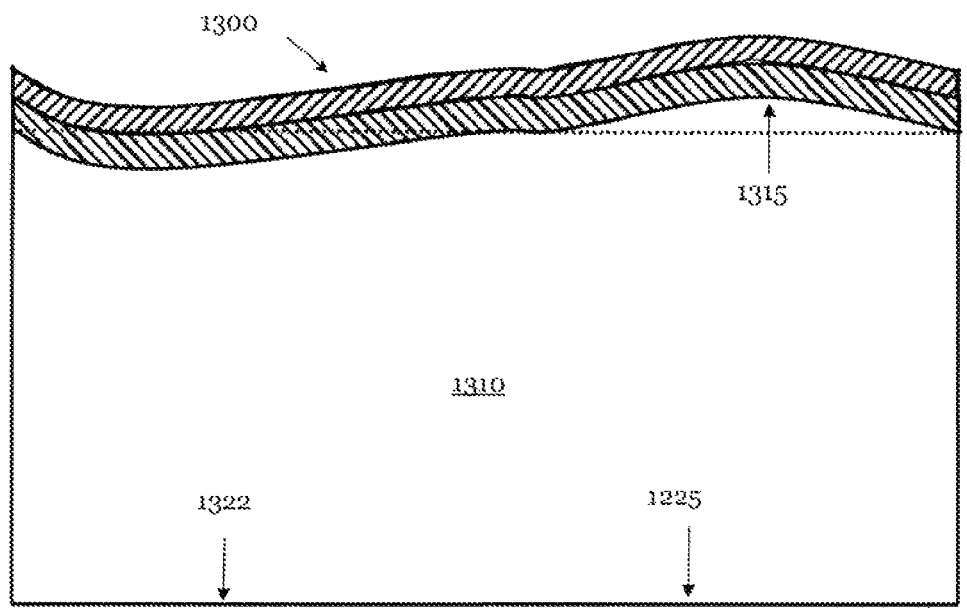
FIG. 13 schematically represents a substrate of an EUV photolithographic mask having a bump and a depression of the front substrate surface with respect to a predetermined height of the substrate.

FIG. 13 illustrates still a further aspect of the present invention. In this figure the front substrate surface 1315 of the substrate 1310 of the photolithographic mask 1300 has both a bump (right part) and a depression (left part) with respect to a predetermined front substrate surface (indicated by the dashed line). The front substrate surface 1315 may now be planed by taking the point having the smallest substrate thickness as reference level, and removing all deviations from this height using the above described method of color center generation. However, this process may take a long time, and more important will reduce the overall thickness of the substrate 1310 below the predetermined value. The numerical value of this deviation has to be individually determined and compensated for each photolithographic mask in order to avoid aberrations.

Therefore, it may be desirable to remove the flatness imperfections of the front substrate surface 1315 and at the same time to keep the overall thickness of the substrate 1310 of the photolithographic mask 1300 at the predetermined value. This can be achieved if the bump can be removed and the depression can be filled. In the context of the discussion of FIG. 10, it has already been described how to remove the bump of the front substrate surface 1315. As in FIGS. 10 and 12 the photolithographic mask 1300 has on its rear substrate surface 1225 a transparent conductive coating 1222.

Figure 14:
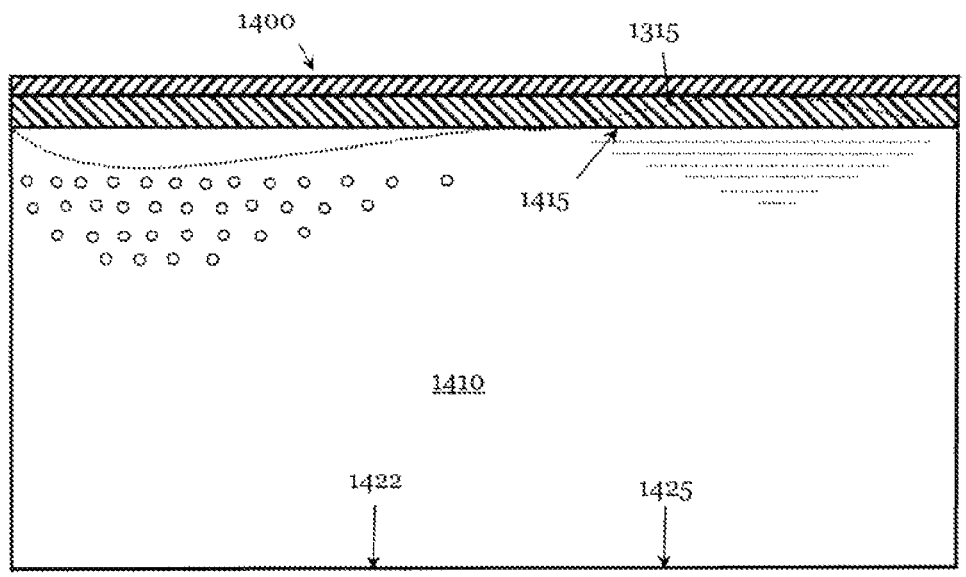
FIG. 14 schematically shows the substrate of the EUV photolithographic mask of FIG. 13 after correction of the front substrate surface using the optical breakdown to remove the depression and using the generation of color centers to remove the bump of the front substrate surface of FIG. 13.

FIG. 14 illustrates how to remove the depression of the front substrate surface 1315 of the substrate 1310 of the photolithographic mask 1300. In the second part of this specification, it has already been discussed that the application of localized femtosecond light pulses can also lead to a breakdown of the fused silica of the substrate 1410 of the photolithographic mask 1400. This breakdown leads to the expansion of a damaged zone and the formation of expansion stress in the material. Thus, the generation of breakdown zones which correlates to the deviation of the depression from the predetermined substrate height can increase the front substrate surface 1315 of FIG. 13. In the breakdown mode the pulse duration of the femtosecond light pulses is 500 fs and repetition rate is 100 kHz. The focal point diameter is 2.5 μm at a pitch of 3 μm. The distance of the plane of femtosecond light pulses from the front substrate surface 1415 is 400 μm and the distance between the layers of the breakdown zones generated by the femtosecond light pulses is 100 μm. As indicated in FIG. 14, the front substrate surface 1415 of the substrate 1410 corresponds essentially to the predetermined front substrate surface 1415 in FIG. 14.

Figure 15:
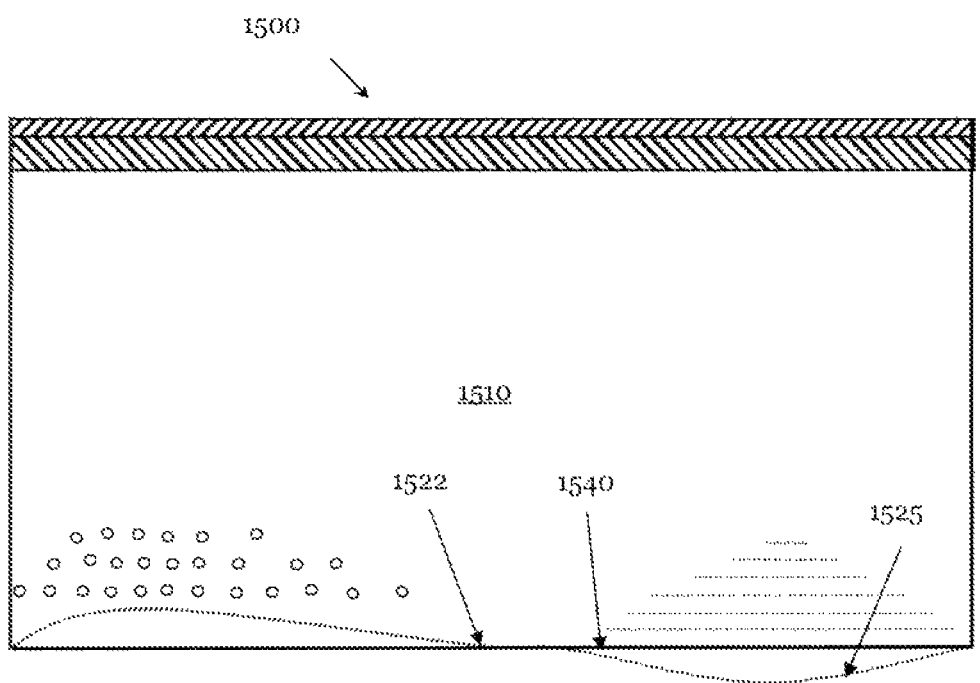
FIG. 15 schematically represent a substrate of an EUV photolithographic mask whose rear substrate surface has been corrected using the optical breakdown to remove the depression and using the generation of color centers to remove the bump of the rear substrate surface.

The principles discussed in the context of FIGS. 13 and 14 can also be applied to correct imperfections of the rear surface substrate 1525 of the substrate 1510 of the photolithographic mask 1500, as it is schematically illustrated in FIG. 15. Similar to photolithographic masks 200, 1000, 1100, 1200, 1300, 1400, the photolithographic mask 1500 also has a transparent conductive coating 1522 on the imperfect rear substrate surface 1525. By means of the application of femtosecond light pulses of the pulsed light source 330 according to the above discussed methods the imperfect rear substrate surface 1525 can be smoothed to an essentially flat surface, as is indicated by the reference number 1540 in FIG. 15.

Figure 16:
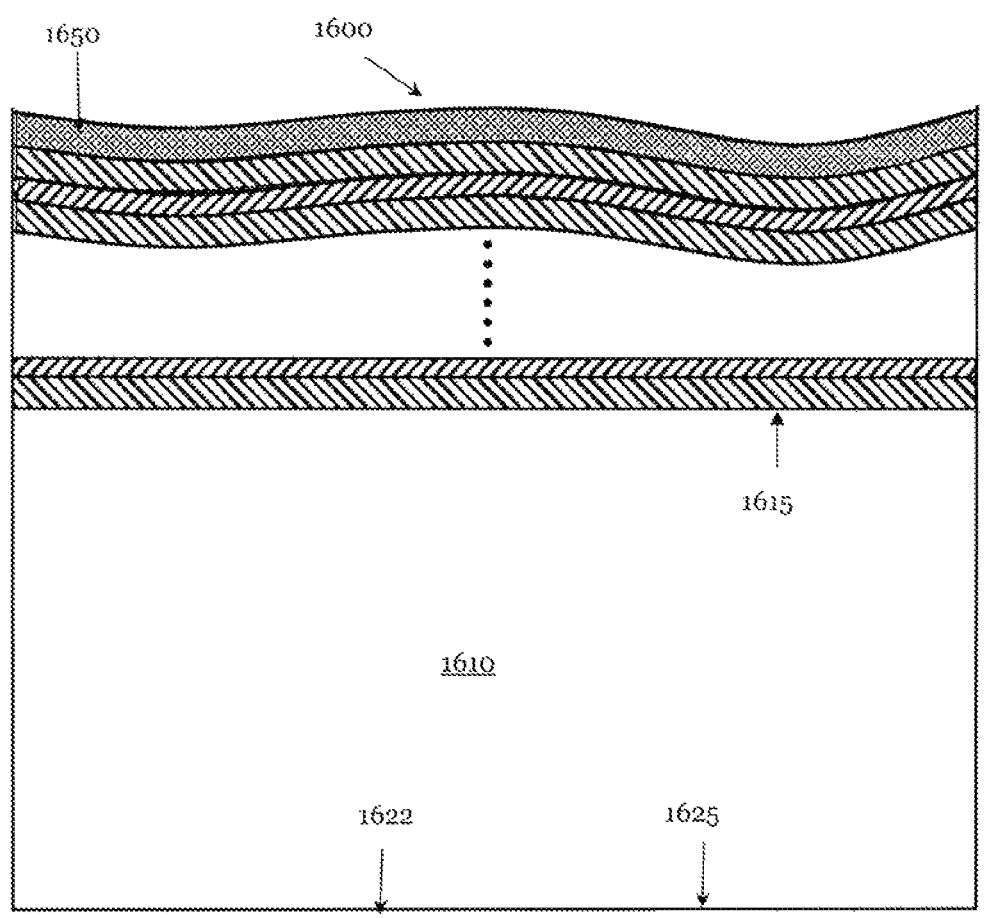
FIG. 16 schematically represents the EUV photolithographic mask without the absorbing structure of FIG. 1, but with a plan front substrate surface and imperfections of the upper MoSi layers of the multi-layer system of FIG. 1.

As already indicated during the discussion of FIG. 2, the coating of a multi-layer mirror structure comprising approximately 40 MoSi layers may lead to imperfections in the top MoSi layers below the capping layer 1650 even when the rear substrate surface 1515 is essentially flat. Small fluctuations in the layer thickness of individual MoSi layers may add up and may result in the imperfections schematically illustrated in FIG. 16. The absorbing structure of the photolithographic mask 1600 has been omitted (cf. FIG. 1). The situation presented in FIG. 16 will result in serious aberrations of the photolithographic mask 1600 since the major part of the EUV photons is reflected from top MoSi layers below the capping layer 1650 which have the largest imperfections.

Figure 17:
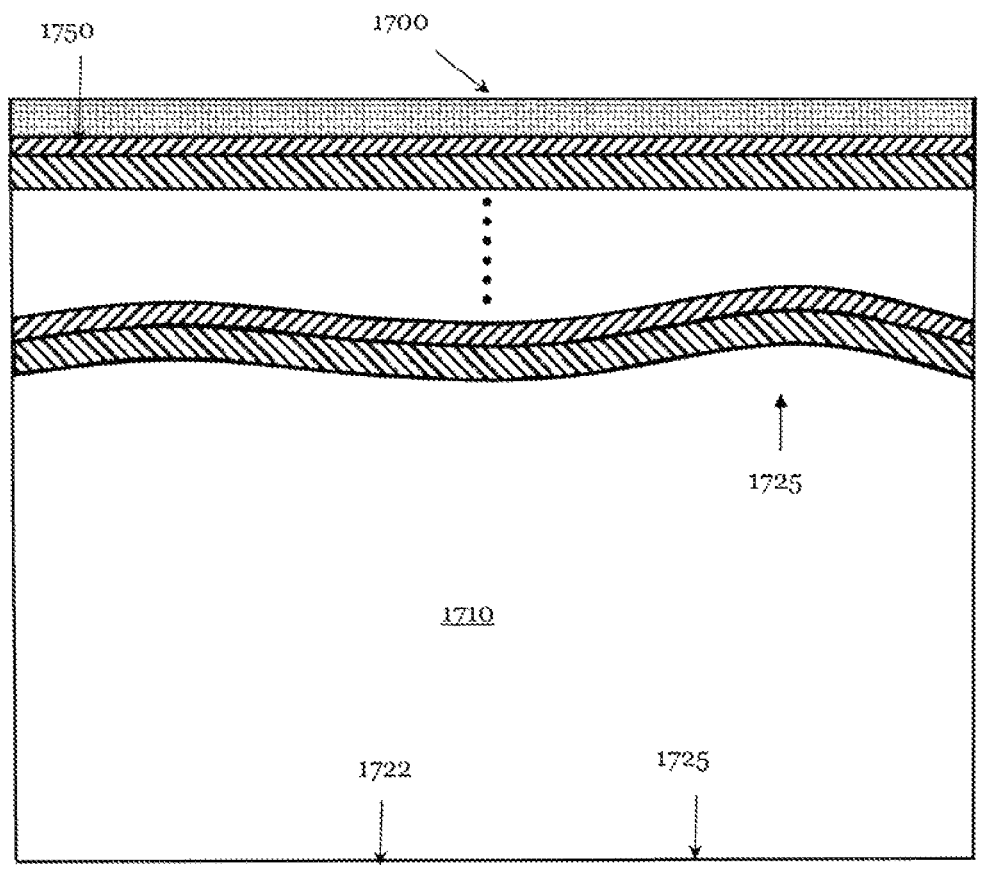
FIG. 17 schematically shows the EUV photolithographic mask of FIG. 16 after correction of the upper MoSi layers by straining the front substrate surface using the methods of FIG. 14.

The inventive principle may also be applied to significantly improve imperfections of the multi-layer mirror system of the photolithographic mask 1600. FIG. 17 illustrates a distortion of an originally flat front substrate surface 1615 to a distorted front substrate surface 1715, so that the top MoSi layers below the capping layer 1750 are essentially smoothed by using some of the methods discussed above. The photolithographic mask 1700 shows significantly less aberrations than the photolithographic mask 1600 of FIG. 16.

As a consequence, the combination of both, the application of local breakdown and the local generation of color centers can correct front substrate surfaces and/or imperfections of the multi-layer system of photolithographic masks.

What is claimed is:

1. A method of modifying a surface of a substrate of an optical component for extreme ultraviolet radiation, the method comprising the step of:
focusing femtosecond light pulses of a laser system onto the substrate so that a plurality of color centers is generated inside the substrate, wherein the color centers are distributed to cause a modification of the substrate surface, and wherein a wavelength of the femtosecond light pulses varies in a range of about 0.3 μm to 3.0 μm.

2. The method of claim 1, wherein the generated color centers are distributed to cause a compaction of the substrate so that a height of the substrate surface is reduced.

3. The method of claim 1, further comprising the step of measuring the absorption of the generated color centers to determine the height reduction of the substrate surface.

4. The method of claim 1, wherein a focal point of the femtosecond light pulses is varied within the substrate and/or the femtosecond light pulses are varied in three dimensions and/or varied focal points are overlapping.

5. The method of claim 1, wherein a repetition rate for the femtosecond light pulses ranges from about 1 Hz to 100 MHz and/or the femtosecond light pulses have a pulse energy within a range of 0.01 µJ and 10 mJ and/or the femtosecond light pulses have a pulse duration in the range of 10 fs to 10000 fs.

6. The method of claim 1, wherein the femtosecond light pulses are focused into the substrate through a rear substrate surface so that the generated color centers cause a modification of a front substrate surface opposite to the rear substrate surface and/or the femtosecond light pulses are focused into the substrate through the rear substrate surface so that the generated color centers cause a modification of the rear substrate surface.

7. The method of claim 1, wherein the laser source comprises:
   a. at least one light source for generating light pulses of variable pulse duration, repetition rate and energy;
   b. at least one objective for focusing light pulses of a light beam; and
   c. at least one scanning unit for scanning the light beam across the substrate surface, wherein the pulse duration, the repetition rate, the energy and/or the focusing are selected such that color centers are generated in the portion of the substrate.

8. The method of claim 7, wherein the at least one scanning unit is adapted to vary the focal point of the laser beam in beam direction and/or a substrate holder is adapted to hold the substrate and to scan the substrate in two and/or three dimensions with respect to the light beam and or the at least one scanning unit and/or the substrate holder are adapted to scan the laser beam so that the light pulses overlap in three dimension.

9. The method of claim 7, wherein the at least one light source and the at least one objective are adapted to generate intensities up to about $10^{20}$ W/cm$^2$ and/or the at least one objective is adapted to generate focal points having a diameter of about 1 µm.

10. The method of claim 1, wherein the optical component is a mirror for extreme ultraviolet radiation, the mirror comprising:
    a. at least one substrate having at least one multi-layer structure on a first side; and
    b. at least one transparent conductive coating on a second side of the substrate opposite to the first side.

11. The method of claim 1, wherein the optical component is a photolithographic mask for extreme ultraviolet radiation, comprising:
    a. at least one substrate having at least one multi-layer structure and at least one absorbing structure on a first side; and
    b. at least one transparent conductive coating on a second side of the substrate opposite to the first side.

12. The method of claim 10 or claim 11, wherein the at least one transparent conductive coating comprises indium tin oxide and/or comprises fluorine tin oxide and/or aluminum zinc oxide and/or antimony tin oxide.

* * * * *

UNITED STATES PATENT AND TRADEMARK OFFICE
CERTIFICATE OF CORRECTION

PATENT NO. : 8,735,030 B2
APPLICATION NO. : 13/084991
DATED : May 27, 2014
INVENTOR(S) : Sergey Oshemkov et al.

It is certified that error appears in the above-identified patent and that said Letters Patent is hereby corrected as shown below:

On the Title Page

Page 2

Column 1 (Other Publications), line 8, delete "aerialiImagebased" and insert -- aerial image based --

Column 1 (Other Publications), line 33, delete "Enginerring" and insert -- Engineering --

Column 1 (Other Publications), line 35, delete "CLEOE-IQUC," and insert -- CLEOE-IQEC, --

Column 2 (Other Publications), line 43, delete "OpticalEngineering" and
    insert -- Optical Engineering --

Column 2 (Other Publications), line 54, after "Jones" delete "et al.,"

Column 2 (Other Publications), line 60, delete "conrtol" and insert -- control --

In the Claims

Column 17

Line 28, in claim 8, delete "and or" and insert -- and/or --

Signed and Sealed this
Twenty-sixth Day of August, 2014

Michelle K. Lee
*Deputy Director of the United States Patent and Trademark Office*